(12) United States Patent
Duan et al.

(10) Patent No.: US 10,663,820 B2
(45) Date of Patent: May 26, 2020

(54) DISPLAY SUBSTRATE, ITS MANUFACTURING METHOD, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xianxue Duan, Beijing (CN); Mingji Bai, Beijing (CN); Dezhi Xu, Beijing (CN); Zhixiang Zou, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 578 days.

(21) Appl. No.: 14/381,823

(22) PCT Filed: Dec. 19, 2013

(86) PCT No.: PCT/CN2013/089981
§ 371 (c)(1),
(2) Date: Aug. 28, 2014

(87) PCT Pub. No.: WO2015/024350
PCT Pub. Date: Feb. 26, 2015

(65) Prior Publication Data
US 2016/0313622 A1    Oct. 27, 2016

(30) Foreign Application Priority Data
Aug. 22, 2013  (CN) .......................... 2013 1 0370380

(51) Int. Cl.
*H01L 27/12* (2006.01)
*G02F 1/1362* (2006.01)
(Continued)

(52) U.S. Cl.
CPC ...... *G02F 1/136286* (2013.01); *G02F 1/1368* (2013.01); *G02F 1/134309* (2013.01);
(Continued)

(58) Field of Classification Search
CPC ............. H01L 27/1225; H01L 27/1248; H01L 27/1288
See application file for complete search history.

(56) References Cited

U.S. PATENT DOCUMENTS 6,624,871 B1 * 9/2003 Kim ................. G02F 1/136259
349/122
6,989,299 B2   1/2006 Dai et al.
(Continued)

FOREIGN PATENT DOCUMENTS

CN      102769039        11/2012
CN      102938394 A  *   2/2013
(Continued)

OTHER PUBLICATIONS

First Office Action for Chinese Application No. 201510178332.3, dated Mar. 16, 2017, 5 Pages.
(Continued)

*Primary Examiner* — Cuong Q Nguyen
*Assistant Examiner* — Peter M Albrecht
(74) *Attorney, Agent, or Firm* — Brooks Kushman P.C.

(57) ABSTRACT

A method for manufacturing a display substrate includes a step of forming a pattern of a barrier layer and a pattern of a first electrode. The step of forming the pattern of the barrier layer and the pattern of the first electrode includes: forming a barrier layer film and a first electrode film
(Continued)

sequentially; and forming the pattern of the barrier layer and the pattern of the first electrode by a single patterning process.

19 Claims, 7 Drawing Sheets

(51) Int. Cl.
  *G02F 1/1343* (2006.01)
  *G02F 1/1368* (2006.01)
  *H01L 29/786* (2006.01)
(52) U.S. Cl.
  CPC ...... *G02F 1/136227* (2013.01); *H01L 27/124* (2013.01); *H01L 27/1225* (2013.01); *H01L 27/1248* (2013.01); *H01L 27/1288* (2013.01); *H01L 29/7869* (2013.01); *G02F 2001/134318* (2013.01); *G02F 2001/134372* (2013.01); *G02F 2001/136236* (2013.01); *G02F 2001/136295* (2013.01); *G02F 2201/121* (2013.01); *G02F 2201/123* (2013.01)

(56) References Cited

U.S. PATENT DOCUMENTS

| | | | | |
|---|---|---|---|---|
| 2009/0026450 A1* | 1/2009 | Lee | ............. | H01L 29/7869 257/59 |
| 2009/0149030 A1* | 6/2009 | Chang | ............. | C09K 13/04 438/752 |
| 2010/0140612 A1* | 6/2010 | Omura | ............. | H01L 29/78618 257/43 |
| 2011/0007234 A1* | 1/2011 | Liu | ............. | H01L 27/1214 349/43 |
| 2012/0107983 A1* | 5/2012 | Choi | ............. | H01L 21/77 438/34 |
| 2012/0126236 A1* | 5/2012 | Juhmonji | ............. | H01L 27/124 257/59 |
| 2013/0228772 A1* | 9/2013 | Choi | ............. | H01L 27/1225 257/43 |
| 2014/0138717 A1* | 5/2014 | Kong | ............. | G02F 1/133555 257/88 |

FOREIGN PATENT DOCUMENTS

| | | | |
|---|---|---|---|
| CN | 102945828 | | 2/2013 |
| CN | 103021939 | | 4/2013 |
| CN | 103021939 A | | 4/2013 |
| CN | 203118950 | | 8/2013 |
| CN | 203118950 U | | 8/2013 |
| CN | 103441100 | | 12/2013 |
| JP | 2001264798 A | * | 9/2001 |
| KR | 20110087056 A | | 8/2011 |
| KR | 20130043512 A | * | 4/2013 |

OTHER PUBLICATIONS

Written Opinion in PCT International Application No. PCT/CN2013/089981, dated May 28, 2014.
International Search Report issued in corresponding International Application No. PCT/CN2013/089981 dated May 28, 2014.
Office Action issued in corresponding Chinese Application No. 2013103703803 dated Nov. 27, 2014.

* cited by examiner

DISPLAY SUBSTRATE, ITS MANUFACTURING METHOD, AND DISPLAY DEVICE

CROSS-REFERENCE TO RELATED APPLICATION

This application is the U.S. national phase of PCT Application No. PCT/CN2013/089981 filed on Dec. 19, 2013, which claims priority to Chinese Patent Application No. 201310370380.3 filed on Aug. 22, 2013, the disclosures of which are incorporated in their entirety by reference herein.

TECHNICAL FIELD

The present invention relates to the field of display technology, in particular to a display substrate, its manufacturing method, and a display device.

BACKGROUND

Along with the development of thin film transistor liquid crystal display (TFT-LCD) technology, more and more new technologies have been presented and applied. Among them, the TFT-LCD in an advanced super dimension switch (AD-SDS, ADS for short) mode has attracted more and more attention due to its features such as low power consumption and wide view angle.

For the ADS technology, it mainly refers to the formation of a multi-dimensional electric field through electric fields generated at edges of slit electrodes in an identical plane and an electric field generated between a slit electrode layer and a plate electrode layer, so as to rotate all the orientational liquid crystal molecules between the slit electrodes and right above the electrodes in a liquid crystal cell, thereby to improve the working efficiency of the liquid crystal molecules and increase the light transmittance. A TFT-LCD product using the ADS technology can provide excellent image quality, and meanwhile has such advantages as a high resolution, high light transmittance, a wide view angle, a high aperture ratio, low chromatic aberration, and no push Mura.

As compared to a TFT with an active layer made of a-Si in the prior art, the TFT with an active layer made of a metal oxide has such features as a high migration rate, a low manufacturing temperature, well uniformity, being transparent to visible light, and a low threshold voltage. Hence, it may be used to achieve a high aperture ratio and low power consumption, and will have great potential in future.

Hence, a display substrate with the advantages of both the ADS technology and the metal oxide TFT will have greater potential in future. However, the metal oxide is susceptible to $H_2$ and $H_2O$. In order to prevent the metal oxide from being adversely affected by an etchant used in a subsequent wet etching step, it is required to add a barrier layer on a surface of the metal oxide for protection. Usually, the barrier layer is required to be subjected to a single mask exposure process separately, so as to form via-holes, through which a source/drain electrode of the TFT connects with the metal oxide. Such a structure results in an increase in the production cost of a mask plate as well as a complex process.

For the ADS-type TFT-LCD with the active layer made of the metal oxide, seven patterning processes are required in the prior art, and each patterning process includes such steps as film-forming, exposing, developing, etching and peeling off. Too many patterning processes will directly result in an increase in the production cost of a display device. Hence, there is an urgent need to further reduce the number of the patterning processes.

SUMMARY

An object of an embodiment of the present invention is to provide a display substrate, its manufacturing method, and a display device, so as to reduce the number of patterning processes during the manufacturing of the display substrate, thereby to effectively reduce the production cost of a product.

In one aspect, an embodiment of the present invention provides a method for manufacturing a display substrate, including the steps of:
  providing a substrate and forming a pattern of a gate insulating layer and a pattern of an active layer on the substrate;
  forming a barrier layer film and a first electrode film sequentially; and
  forming a pattern of the barrier layer and the first electrode by a single patterning process.

In another aspect, an embodiment of the present invention provides a display substrate manufactured by the above-mentioned method. The display substrate at least includes patterns of a gate insulating layer, an active layer, a barrier layer and a first electrode.

The pattern of the barrier layer is located above the gate insulating layer and the active layer, and includes a first via-hole region, a first thickness region and a second thickness region.

The first via-hole region of the pattern of the barrier layer includes a pattern of a first via-hole that penetrates the entire barrier layer so as to partially expose the active layer.

The first thickness region of the pattern of the barrier layer is located above the gate insulating layer and corresponds to the first electrode of the display substrate.

The second thickness region of the pattern of the barrier layer is located at a region other than the first via-hole region and the first thickness region, and the barrier layer corresponding to the second thickness region has a thickness less than that of the barrier layer corresponding to the first thickness region.

The pattern of the first electrode is located above the first thickness region of the barrier layer, and has a same boundary as the first thickness region.

In yet another aspect, the present invention provides a display device including the above-mentioned display substrate.

According to the display substrate, its manufacturing method and the display device, the patterns of the barrier layer and the first electrode are formed simultaneously by a single patterning process. As compared with the prior art, a separate patterning process for forming the pattern of the barrier layer is omitted, and the number of the patterning processes used for manufacturing an ADS-type display substrate with an active layer made of a metal oxide is reduced from seven to six. As a result, it is able to reduce the steps for producing a product, thereby to remarkably reduce the production cost thereof.

Figure 1:
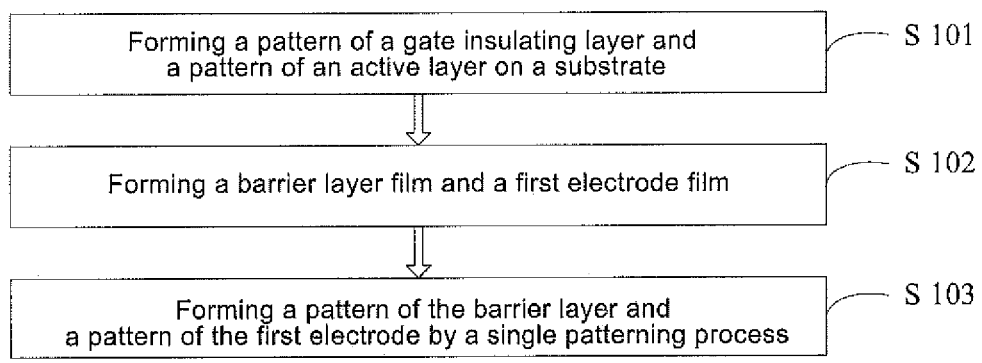
FIG. 1 is a flow chart of a method for manufacturing a display substrate according to one embodiment of the present invention.

REFERENCE NUMBER LIST 1 substrate
2 gate electrode
3 common electrode line
4 gate insulating layer
5 active layer
6 barrier layer
7 first electrode film
8 positive photoresist
9 first electrode
10 first via-hole
11 source electrode
12 channel region
13 drain electrode
14 passivation layer
15 second via-hole
16 second electrode

DETAILED DESCRIPTION

At first, it is to be noted that, in the present invention, the word "on" in such expressions as "X is arranged on Y" refers to that X is in contact with Y and located above Y. As shown in the drawings, a substrate is arranged at the bottom. The so-called patterning processes in the present invention include coating a photoresist, masking, exposing, developing, etching, and peeling off the photoresist, and a positive photoresist is taken as an example. The term "a . . . region" in the present invention refers to a region where a pattern is mapped onto the substrate, i.e., this region has a shape identical to the pattern. For example, a gate line region just refers to a region where a pattern of the gate line is mapped onto the substrate, or a region on the substrate where the pattern of the gate line is to be arranged.

The present invention will be described hereinafter in conjunction with the drawings and the embodiments. Obviously, the following embodiments merely relate to parts of, rather than all of, the embodiment of the present invention, and a person skilled in the art, without any creative effort, may obtain the other embodiments based thereon, which also falls within the scope of the present invention.

First Embodiment

FIG. 1 is a flow chart of a method for manufacturing a display substrate according to one embodiment of the present invention.

As shown in FIG. 1, the method includes the following steps.

Step S101: providing a substrate, and forming a pattern of a gate insulating layer and a pattern of an active layer on the substrate. The step of forming the pattern of the gate insulating layer and the pattern of the active layer includes the following steps.

Figure 5:
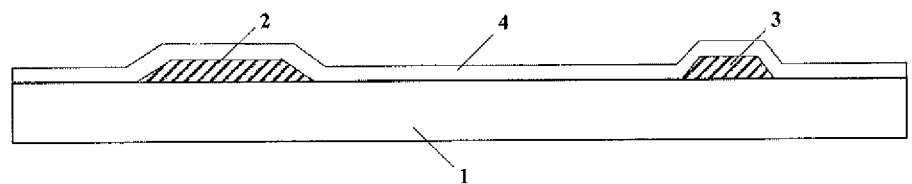
FIG. 5 is a schematic view showing the substrate in FIG. 4 provided with a gate insulating layer.

Step 1: forming the gate insulating layer on the substrate. As shown in FIG. 5, a gate insulating layer film is deposited on the substrate by plasma enhanced chemical vapor deposition (PECVD) or magnetron spattering, so as to form the gate insulating layer 4. The gate insulating layer 4 may be made of an oxide, a nitride, or an oxynitride.

Figure 6:
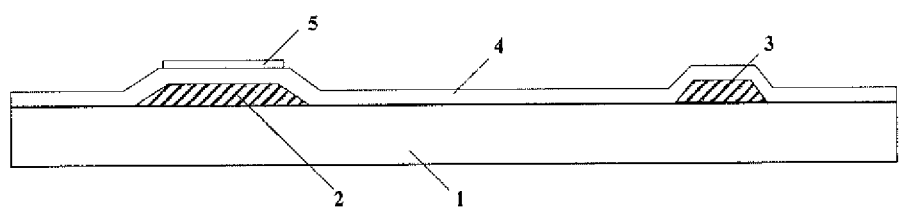
FIG. 6 is a schematic view showing the substrate in FIG. 5 provided with an active layer.

Step 2: forming the pattern of the active layer on the gate insulating layer 4. An active layer film is deposited on the substrate with the gate insulating layer 4. To be specific, the active layer is made of a transparent metal oxide with semiconductor properties, such as at least one selected from the group consisting of InGaZnO, InGaO, ITZO and AlZnO. A photoresist layer is coated onto the metal oxide, and then exposed and developed through a mask plate with a specific pattern, so as to provide a pattern. The metal oxide not covered by the photoresist is peeled off and then the remaining photoresist are removed, so as to form the pattern of the active layer 5 on a surface of the gate insulating layer 4, as shown in FIG. 6.

Step S102: depositing a barrier layer film and a first electrode film on the pattern of the active layer and the gate insulating layer.

Figure 7:
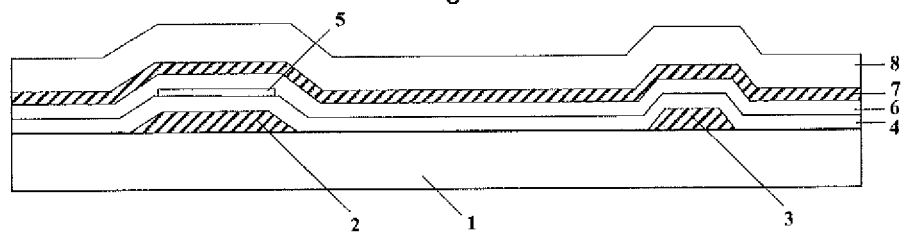
FIG. 7 is a schematic view showing the substrate in FIG. 6 deposited with a barrier layer film and a first electrode film, and coated with a positive photoresist.

To be specific, as shown in FIG. 7, the barrier layer film and the first electrode film 7 are sequentially formed on the substrate with the pattern of the active layer 5 by PECVD or magnetron spattering. The barrier layer film may be a dense material such as SiN, SiO and SiON, and the first electrode film may be made of a transparent conductive material such as ITO, ZnO, InGaZnO, InZnO and InGaO.

Step S103: forming a pattern of the barrier layer and a pattern of the first electrode by a single patterning process. To be specific, the patterns of the barrier layer and the first electrode may be formed on the substrate with the barrier layer film and the first electrode film by a single patterning process. The pattern of the barrier layer is located at surfaces of the pattern of the active layer and the gate insulating layer and covers a channel region of a TFT, and it is provided with a first via-hole for connecting the active layer and a source/drain electrode.

Figure 2:
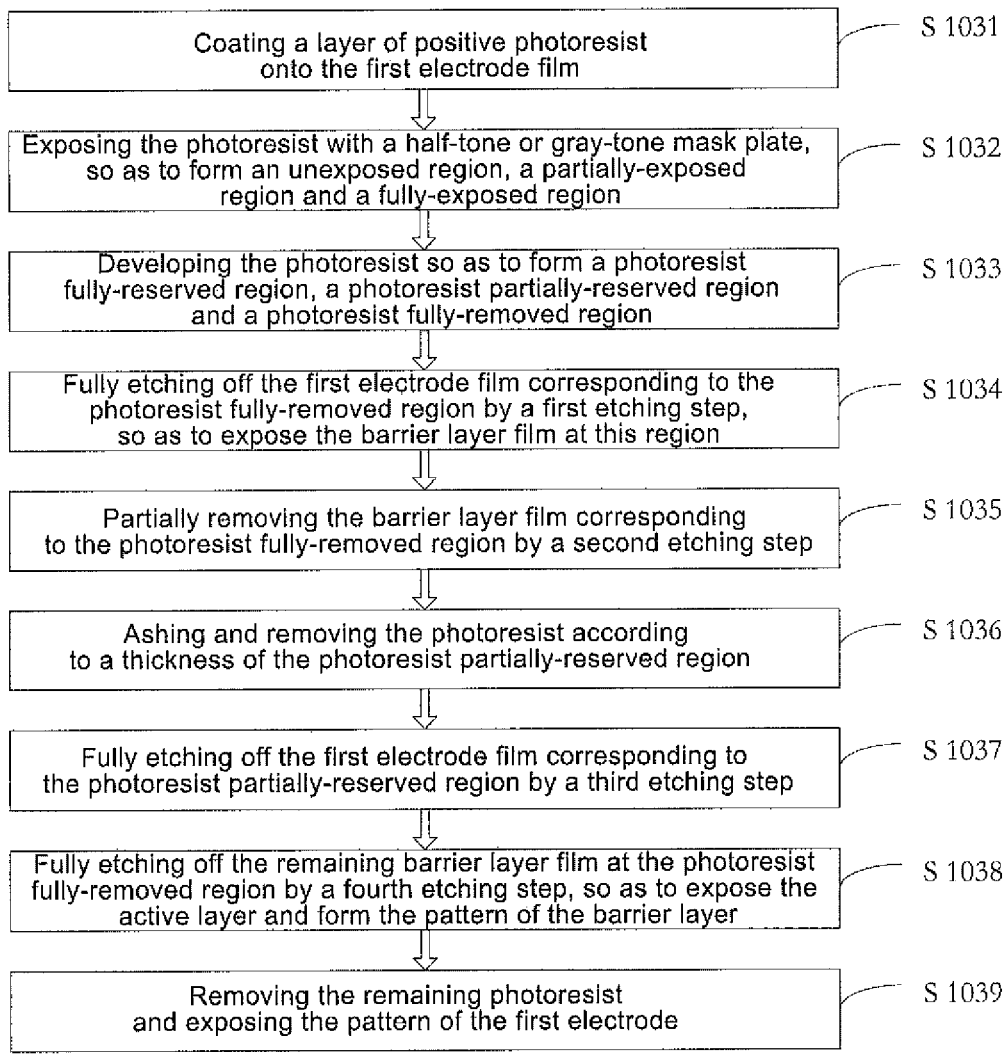
FIG. 2 is a flow chart of steps of forming a pattern of a barrier layer and a first electrode by a single patterning process according to one embodiment of the present invention.

FIG. 2 is a flow chart of steps of forming the patterns of the barrier layer and the first electrode in the method for manufacturing the display substrate. Step S103 in the flow chart of FIG. 1 specifically includes the following steps.

Step S1031: as shown in FIG. 7, coating a layer of a positive photoresist 8 onto the first electrode film 7.

Step S1032: exposing the photoresist with a half-tone or gray-tone mask plate, so as to form an unexposed region corresponding to a region where the pattern of the first electrode is located, a partially-exposed region corresponding to a region where the pattern of the first via-hole is located, and a fully-exposed region corresponding to the other region.

Figure 8:
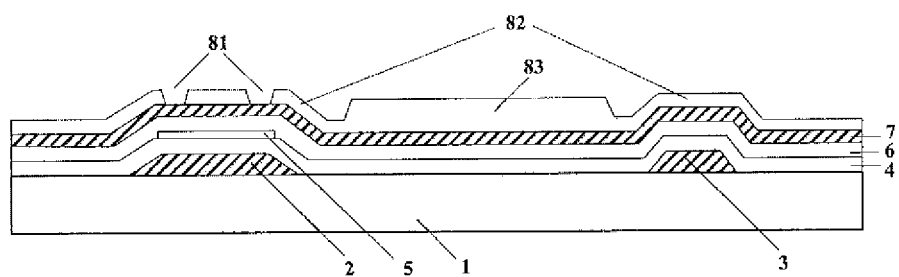
FIG. 8 is a schematic view showing the substrate in FIG. 7 after it is subjected to exposure and development.

Step S1033: developing the photoresist, so that a thickness of the photoresist at the unexposed region remains unchanged so as to form a photoresist fully-reserved region, a thickness of the photoresist at the partially-exposed region is reduced so as to form a photoresist particularly-reserved region, and the photoresist at the fully-exposed region is fully removed so as to form a photoresist fully-removed region. As shown in FIG. 8, the developed photoresist includes three regions with different thicknesses. The photoresist 83 at a region corresponding to a first electrode region has a thickness of t1, the photoresist 82 at a region corresponding to a region other than the first electrode region and a first via-hole region has a thickness of t2, and the photoresist 81 at a region corresponding to the first via-hole region has a thickness of t3, wherein t1>t2, and t3=0.

Figure 9:
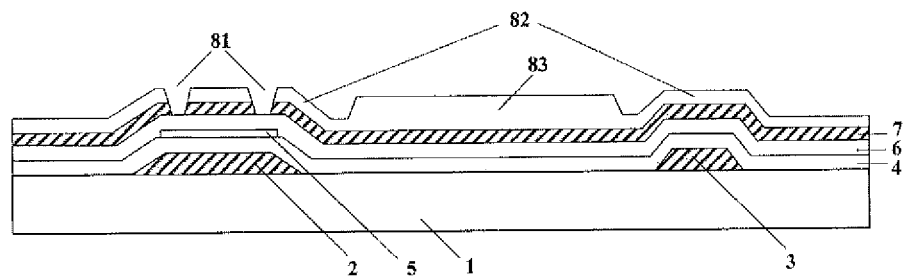
FIG. 9 is a schematic view showing the substrate in FIG. 8 after a first etching step.

Step S1034: fully etching off the first electrode film corresponding to the photoresist fully-removed region by a first etching step, so as to expose the barrier layer film at this region. To be specific, the first electrode film is made of a transparent conductive material such as ITO, ZnO, InGaZnO, InZnO and InGaO, so a wet etching step is usually used in industry so as to etch the first electrode film, while the barrier layer film is made of a dense material such as SiN, SiO and SiON, so a dry etching step is usually used to etch the barrier layer film. In order to ensure fully etching off the first electrode film corresponding to the photoresist fully-removed region, the wet etching step using an etchant with a certain selection ratio may be used, and the etching time may be set as 110% to 300% of the time for fully etching off the first electrode film corresponding to the photoresist fully-removed region. After the etching step, a pattern as shown in FIG. 9 is formed.

Figure 10:
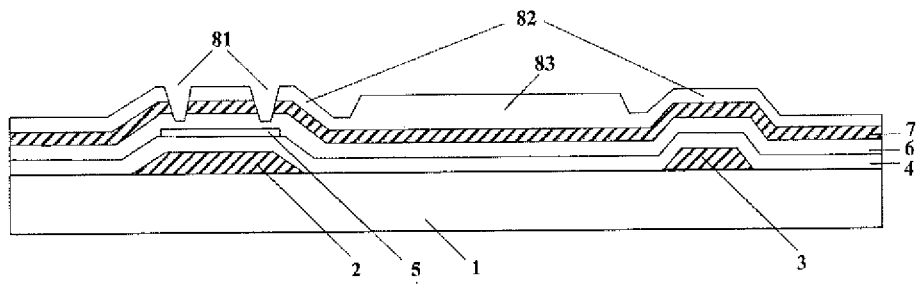
FIG. 10 is a schematic view showing the substrate in FIG. 9 after a second etching step.

Step S1035: partially removing the barrier layer film corresponding to the photoresist fully-removed region by a second etching step. As mentioned in Step S1034, the second etching step may be a dry etching step. In order to ensure that merely the barrier layer film corresponding to the photoresist fully-removed region is partially removed in this etching step, the etching time shall be less than the time for fully etching off the barrier layer corresponding to the photoresist fully-removed region. After the second etching step, a pattern as shown in FIG. 10 is formed.

Figure 11:
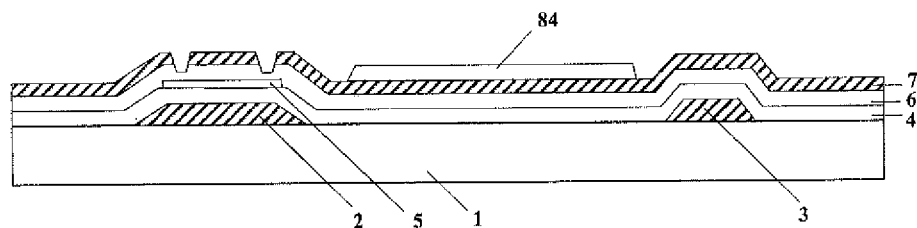
FIG. 11 is a schematic view showing the substrate in FIG. 10 after the photoresist is ashed.

Step S1036: ashing and removing the photoresist according to the thickness of the photoresist particularly-reserved region, so as to fully remove the photoresist at the photoresist partially-reserved region and reduce the thickness of the photoresist at the photoresist fully-reserved region. After the photoresist is ashed, a pattern as shown in FIG. 11 is formed. As compared with the pattern as shown in FIG. 10, after the photoresist is ashed according to the thickness of the photoresist partially-reserved region, the photoresist 82 at the photoresist partially-reserved region in FIG. 10 is fully removed so as to expose the first electrode film 7, and the thickness of the photoresist at the photoresist fully-reserved region 83 is reduced. Finally, a photoresist pattern 84 is formed.

Figure 12:
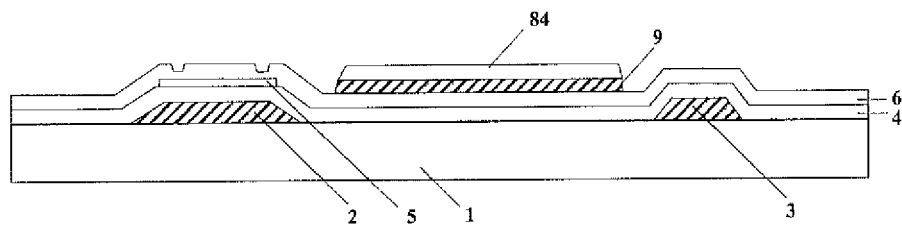
FIG. 12 is a schematic view showing the substrate in FIG. 11 after a third etching step.

Step S1037: fully etching off the first electrode film 7 corresponding to the photoresist partially-reserved region by a third etching step. Similar to the first etching step, the third etching step may be a wet etching step for etching the first electrode film 7 corresponding to the photoresist partially-reserved region, so as to fully remove the first electrode film 8 at this region. After the third etching step, a pattern as shown in FIG. 12 is formed. It should be noted that, as described in the Background, the barrier layer is provided so as to prevent the active layer from being damaged by the etchant when the wet etching step is used to etch the metal layer. Hence, the reason why the barrier layer film corresponding to the photoresist fully-removed region is partially removed in Step S1035 by the second etching step lies in that, if the barrier layer film corresponding to the photoresist fully-removed region is fully removed, the etchant will adversely affect the active layer 5 when the first electrode film 7 corresponding to the photoresist partially-reserved region is etched off in Step S1037.

Figure 13:
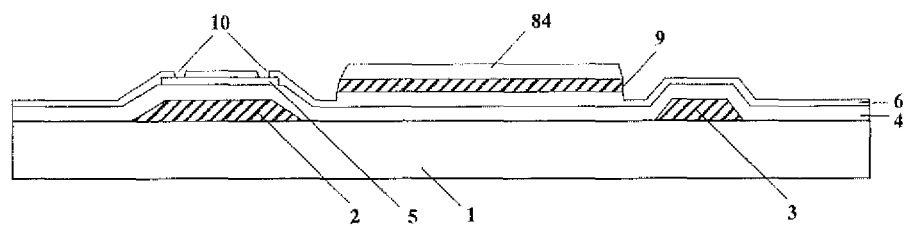
FIG. 13 is one schematic view showing the substrate in FIG. 12 provided with a pattern of a first via-hole after a fourth etching step.
Figure 14:
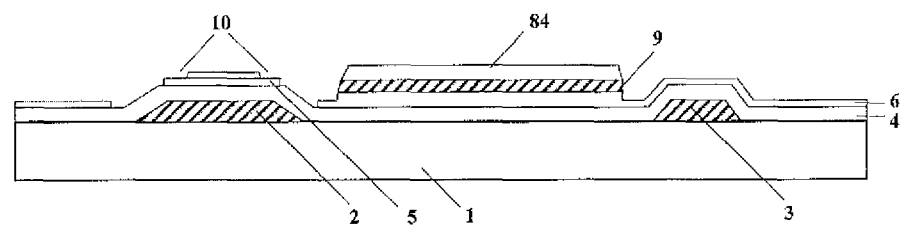
FIG. 14 is another schematic view showing the substrate in FIG. 12 with the pattern of the first via-hole after the fourth etching step.

Step S1038: fully etching off the remaining barrier layer film at the photoresist fully-removed region by a fourth etching step, so as to expose the active layer 5, thereby to form a pattern of the barrier layer. The thickness of the barrier layer film corresponding to the photoresist fully-removed region will be reduced after Step S1037 due to the barrier layer film at the photoresist particularly-reserved region. The pattern of the barrier layer has a first via-hole connecting the active layer 5 and the source/drain electrode of the TFT. The fourth etching step may be a dry etching step. In order to form the pattern of the first via-hole so as to fully expose the active layer made of a metal oxide, and to ensure that the remaining barrier layer film at the photoresist particularly-reserved region still has a certain thickness after this etching step so as to prevent the active layer at a channel from being adversely affected by the etchant when a source/drain metal is etched subsequently, it is required to control the etching time for this etching step. To be specific, the etching time shall be greater than the time for fully etching the remaining barrier layer film at the photoresist fully-removed region and less than the time for fully etching the remaining barrier layer film at the photoresist partially-reserved region. A pattern as shown in FIG. 13 is formed finally. The pattern of the barrier layer 6 includes a first via-hole region, a first thickness region, and a second thickness region. The first via-hole region includes at least two first via-holes 10 that penetrate through the entire barrier layer 6 to partially expose the active layer 5, and an edge of the first via-hole 10 is completely located above the active layer 5. The first via-hole 10 functions as to electrically connect the active layer 5 and the source/drain electrode of the TFT, so the first via-holes with different shapes may be used, as long as the above function can be achieved. The pattern of the via-hole as shown in FIG. 14 may also be formed by Steps S1031 to S1038 using a mask plate with an appropriate shape. As shown in FIG. 14, one end of the edge of the first via-hole 10 is located above the active layer 5, while the other end is located above the gate insulating layer 4. Because the first via-hole in FIG. 14 may be used to expose a side surface of the active layer 5, the first via-hole in FIG. 14 has a larger contact area as compared with the first via-hole in FIG. 13. The first thickness region of the pattern of the barrier layer is located above the gate insulating layer 4 and corresponding to the first electrode 9 of the display substrate. The second thickness region of the pattern of the barrier layer is located at a region other than the first via-hole region and the first thickness region, and the barrier layer corresponding to the second thickness region has a thickness less than the barrier layer corresponding to the first thickness region. It should be appreciated that, as shown in FIG. 13 or 14, the barrier layer for protecting the active layer 5 in the TFT from being adversely affected by the etchant used for etching the source/drain metal layer subsequently is located at the second thickness region.

Step S1039: removing the remaining photoresist so as to expose the pattern of the first electrode.

According to the method of this embodiment, the patterns of the barrier layer and the first electrode are formed by a single patterning process. As compared with the prior art, a patterning process for forming the barrier layer separately is omitted.

Second Embodiment

Figure 3:
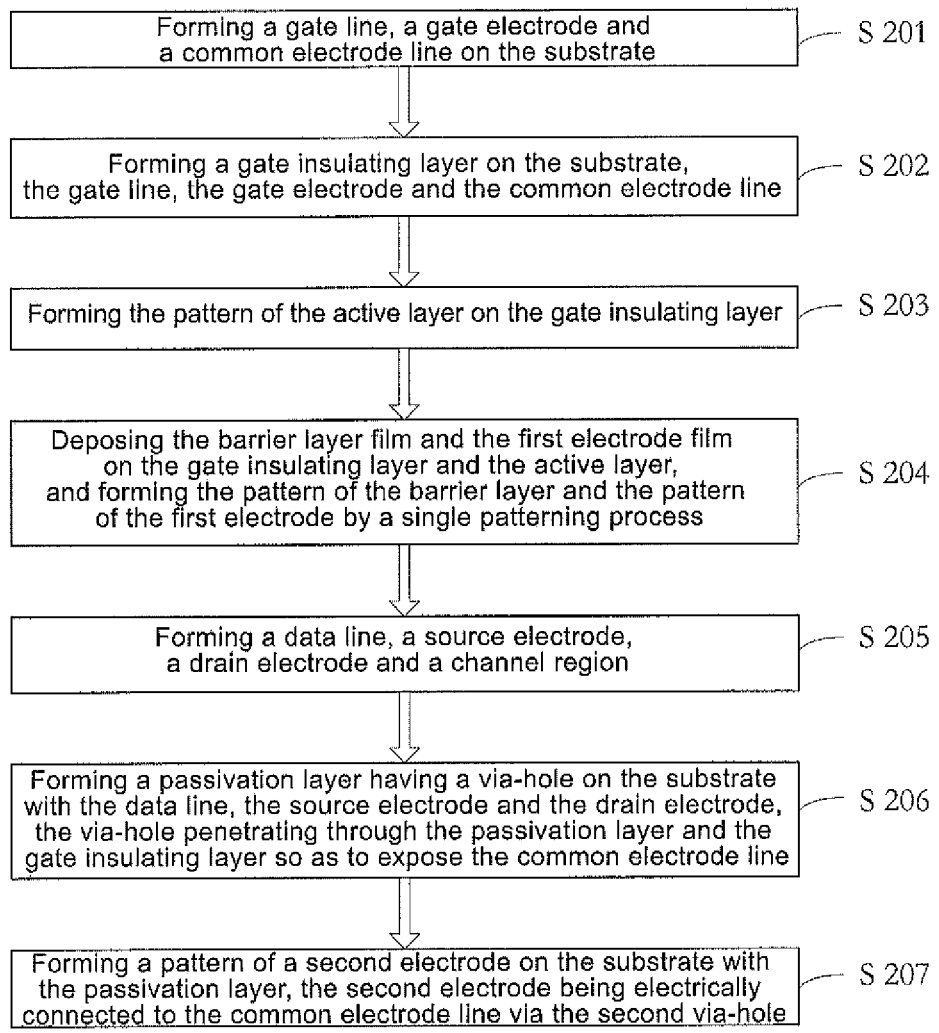
FIG. 3 is a flow chart of the method for manufacturing the display substrate according to another embodiment of the present invention.

FIG. 3 is a flow chart of the method for manufacturing the display substrate according to another embodiment of the present invention. As shown in FIG. 3, the method for manufacturing the display substrate includes the following steps.

Step S201: forming the gate line, the gate electrode 2 and the common electrode line 3 on the substrate.

In the actual production, the substrate may be made of a transparent material with certain solidity, such as glass and transparent resin, and a single patterning process is required to be used so as to form patterns of the gate line, the gate electrode 2 and the common electrode line 3 and the like on the substrate.

Figure 4:
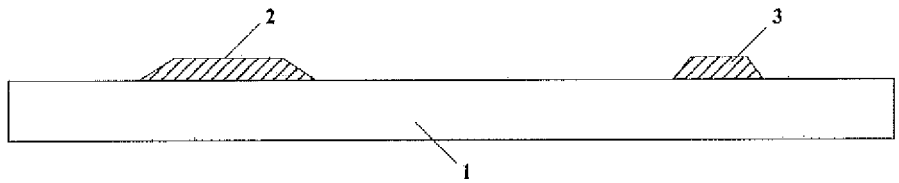
FIG. 4 is a schematic view showing a substrate provided with a gate electrode and a common electrode line.

For example, a metal layer may be formed on the substrate by PECVD, magnetron spattering, thermal evaporation or any other film-forming processes. The metal layer may be a single-layered film made of Mo, Al, an Al/Rb alloy, W, Cr or Cu, or a multiple-layered film made of the above-mentioned metals. The photoresist is coated onto a surface of the metal layer, exposed and developed with a mask plate having a specific pattern so as to form patterns, and peel off the metal layer not covered by the photoresist. As shown in FIG. 4, the patterns of the gate line (not shown), the gate electrode 2 and the common electrode line 3 are finally formed on the surface of the substrate 1.

Step S202: forming the gate insulating layer on the substrate, the gate line, the gate electrode and the common electrode line.

Step S203: forming the pattern of the active layer on the gate insulating layer.

Step S204: deposing the film of the barrier layer and the film of the first electrode on the gate insulating layer, and forming the pattern of the barrier layer and the pattern of the first electrode by a single patterning process.

The above Steps S202, S203 and S204 are the same as Steps S101, S102 and S103 in the first embodiment, and thus will not be repeated herein.

Step S205: forming the data line, the source electrode, the drain electrode and the channel region.

Figure 15:
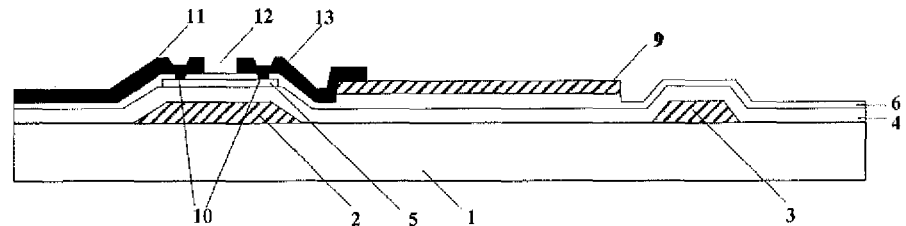
FIG. 15 is a schematic view showing the substrate in FIG. 13 provided with a data line, a source electrode, a drain electrode and a conductive channel region after the photoresist is peeled off.

A metal film is deposited on the substrate obtained after Step S204. The metal film may be made of a metal selected from the group consisting of Cr, W, Ti, Ta, Mo, Al, Cu, or an alloy thereof, or a composite film consisting of several layers of metal films may be used. As shown in FIG. 15, the data line (not shown), the source electrode 11, the drain electrode 13 and the channel region 12 are form on the substrate with the patterns of the barrier layer 6 and the first electrode 9 using a common mask plate by a patterning process. The source electrode 11 and the drain electrode 13 are electrically connected to the active layer 5 via the first via-hole 10, and the drain electrode 13 is lapped onto the first electrode 9.

Step S206: forming a passivation layer having a second via-hole on the substrate with the data line, the source electrode and the drain electrode. The second via-hole penetrates through the passivation layer, the barrier layer and the gate insulating layer, so as to expose the common electrode line.

Figure 16:
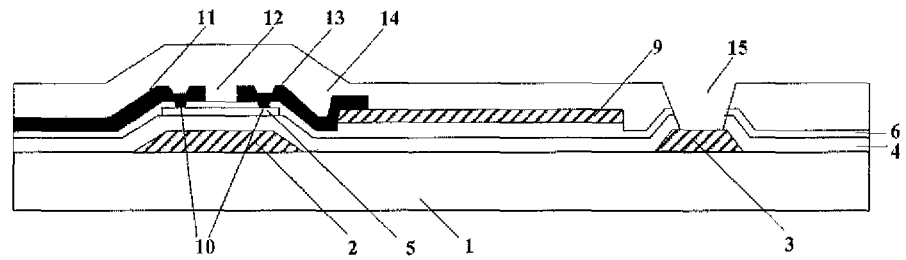
FIG. 16 is a schematic view showing the substrate in FIG. 15 provided with a pattern of a passivation layer with a second via-hole.

The passivation layer 14 is deposited by PECVD, and it may be made of an oxide, a nitride or an oxynitride. A reactive gas may be a mixture of $SiH_4$, $NH_3$ and $N_2$, or a mixture of $SiH_2Cl_2$, $NH_3$ and $N_2$. As shown in FIG. 16, the second via-hole 15 is formed by a patterning process using a common mask plate. The second via-hole is located above the common electrode line 3, and penetrates through the passivation layer 14, the barrier layer 6 and the gate insulating layer 4, so as to expose the common electrode line 3. In this patterning process, patterns of a via-hole (not shown) for a gate line interface at a gate line interface region (gate line PAD) and a via-hole (not shown) for a data line interface at a data line interface region (data line PAD) are also formed, and such a process for forming the patterns of the via-hole for the data line interface and the via-hole for the gate line interface has been widely used in the existing patterning process.

Step S207: forming a pattern of a second electrode on the substrate with the passivation layer by a patterning process, the second electrode being electrically connected to the common electrode line 3 via the second via-hole.

Figure 17:
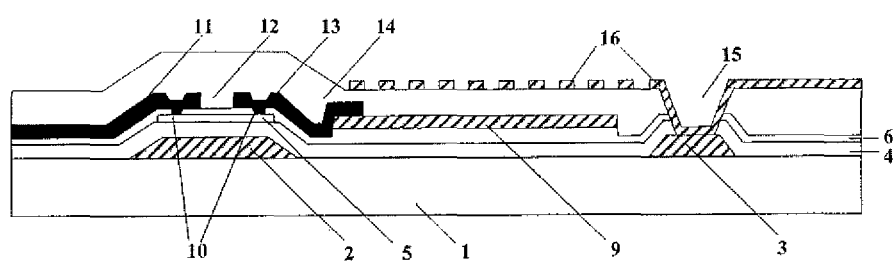
FIG. 17 is a schematic view showing a display substrate according to one embodiment of the present invention.

As shown in FIG. 17, on the substrate obtained after Step S206 is completed, a layer of a second electrode film is deposited by magnetron spattering or thermal evaporation. The second electrode film may be made of a transparent conductive material such as ITO, ZnO, InGaZnO, InZnO and InGaO. The pattern of the second electrode is formed by a patterning process using a common mask plate, and the second electrode 16 is electrically connected to the common electrode line 3 via the second via-hole 15.

It should be appreciated that, in this embodiment, the first electrode 9 is a plate-like pixel electrode, and the second electrode 16 is a slit-like common electrode. A multi-dimensional electric field may be formed between the first electrode 9 and the second electrode 16.

According to the method of this embodiment, the pattern of the barrier layer and the pattern of the first electrode are formed by a single patterning process. As compared with the prior art, the patterning process for forming the barrier layer separately will be omitted, and the number of the patterning processes used for manufacturing an ADS-type display plate with an active layer made of a metal oxide will be reduced from seven to six. As a result, it is able to reduce the steps for producing a product, thereby to remarkably reduce the production cost thereof.

FIG. 17 is a sectional view showing the display substrate according to one embodiment of the present invention.

As shown in FIG. 17, the gate line (not shown), the gate electrode 2, and the common electrode line 3 are formed on the substrate 1, and the gate electrode 2 is spaced apart from the common electrode line 3.

The gate insulating layer 4 is formed above and covers the gate line, the gate electrode 2 and the common electrode line 3. The gate insulating layer 4 may be formed by PECVD, and made of an oxide, a nitride, or an oxynitride.

The active layer 5 is formed on the gate insulating layer 4, and the active layer 5 may be made of a transparent metal oxide with semiconductor properties, such as InGaZnO, InGaO, ITZnO and AlZnO.

The barrier layer 6 is formed above the gate insulating layer 4 and the active layer 5, and it functions as to protect the active layer 5 so as to eliminate the adverse effect of the etchant on the source/drain metal layer made of the metal oxide material when the source/drain metal layer is etched. Usually, the barrier layer may be made of a dense material such as SiN, SiO, and SiON. As shown in FIG. 17, the pattern of the barrier layer 6 includes the first via-hole region, the first thickness region, and the second thickness region. The first via-hole region includes at least two first via-holes 10 that penetrate through the entire barrier layer 6 to partially expose the active layer 5. The first via-hole 10 functions as to electrically connect the active layer 5 and the source/drain electrode of the TFT, so the first via-holes with different shapes may be used, as long as the above function can be achieved. As shown in FIG. 13, the edge of the first via-hole 10 may be completely located above the active layer 5, or as shown in FIG. 14, one end of the edge of the first via-hole 10 may be located above the active layer 5, while the other end may be located above the gate insulating layer 4. Because the first via-hole in FIG. 14 may be used to expose a side surface of the active layer 5, as compared with the first via-hole in FIG. 13, a larger contact area will be acquired. The first thickness region of the barrier layer 6 is located above the gate insulating layer and corresponds to the first electrode 9 of the display substrate. The second thickness region of the barrier layer 6 is located at a region other than the first via-hole region and the first thickness region. The barrier layer corresponding to the second thickness region has a thickness less than the barrier layer corresponding to the first thickness region. It should be appreciated that, the barrier layer 6 for protecting the active layer 5 in the TFT from being adversely affected by the etchant used for etching the source/drain metal layer is located at the second thickness region, as shown in FIG. 17.

The first electrode 9, as a pixel electrode, is foamed on the first thickness region of the barrier layer 6. As mentioned in the above embodiments about the method for manufacturing the display substrate, the pattern of the barrier layer and the pattern of the first electrode are formed by a single patterning process, so the resultant pattern of the first electrode 9 corresponds to the pattern of the first thickness region of the barrier layer 6, and the patterns have the same boundary.

The source electrode 11, the channel region 12, the drain electrode 13 and the date line (not shown) formed together with the source and drain electrodes are formed on surfaces of the barrier layer 6 and the first electrode 9. The source electrode 11 and the drain electrode 13 are electrically connected to the active layer 5 via the first via-hole 10, and the drain electrode 13 is lapped onto the first electrode 9.

The passivation layer 14 including the second via-hole 15 is formed on surfaces of the data line (not shown), the source electrode 11 and the drain electrode 13. The second via-hole 15 penetrates through the passivation layer 14, the barrier layer 6 and the gate insulating layer 4, so as to expose the common electrode line 3.

The second electrode 16 is formed on a surface of the passivation layer, and the second electrode 16 is electrically connected to the common electrode line 3 via the second via-hole 15.

In this embodiment, the first electrode 9 is a plate-like pixel electrode, and the second electrode 16 is a slit-like common electrode. A multi-dimensional electric field may be formed between the first electrode 9 and the second electrode 16. According to the display substrate of this embodiment, the pattern of the barrier layer and the pattern of the first electrode are formed by a single patterning process. As compared with the prior art, a mask process for forming the barrier layer separately will be omitted, and the number of the patterning processes used for manufacturing an ADS-type display plate with an active layer made of a metal oxide will be reduced from seven to six. As a result, it is able to reduce the steps for producing a product, thereby to remarkably reduce the production cost thereof.

It should be appreciated that, in the above embodiments, the display substrate where the pattern of the barrier layer and the pattern of the first electrode are formed by a single patterning process is taken as an example. Any display substrate where the pattern of the barrier layer and the pattern of the first electrode are formed by a single patterning process falls within the scope of the present invention. Hence, through appropriate variations, a display substrate of any other type may be obtained on the basis of the display substrate of this embodiment.

The present invention further provides a display device including the above-mentioned display substrate.

The display substrate may include the TFT, the first electrode and the second electrode. The pattern of the barrier layer and the pattern of the first electrode are formed by a single patterning process.

The display device may be any product or member having a display function, such as a liquid crystal panel, a liquid crystal TV, a liquid crystal display, a digital photo frame, a mobile phone and a flat panel PC.

According to the display device of the present invention, it includes the display substrate where the pattern of the barrier layer and the pattern of the first electrode are formed by a single patterning process. As compared with the prior art, a patterning process for forming the barrier layer separately will be omitted, and the number of the patterning processes used for manufacturing an ADS-type display plate with an active layer made of a metal oxide will be reduced from seven to six. As a result, it is able to reduce the steps for producing a product, thereby to remarkably reduce the production cost thereof.

The above are merely the preferred embodiments of the present invention, and the present invention is not limited thereto. A person skilled in the art may make further variations and substitutions within the disclosure of the present invention, and these variations and substitutions shall also be included in the scope of the present invention. Hence, the scope of the present is subject to the appended claims.

What is claimed is:

1. A method for manufacturing a display substrate, comprising:
    a first step of forming a pattern of a gate insulating layer and a pattern of an active layer on a base substrate;
    a second step of forming a barrier layer film and a pixel electrode film sequentially on the base substrate obtained after the first step;
    a third step of forming a pattern of a barrier layer and a pattern of a pixel electrode by a single patterning process,
    a fourth step of forming a source electrode of a thin film transistor and a drain electrode of the thin film transistor on the base substrate with the pattern of the barrier and the pattern of the pixel electrode, wherein the pattern of the barrier layer comprises a first via-hole region, a second via-hole region, a first thickness region, and a second thickness region;

the first via-hole region of the pattern of the barrier layer comprises a pattern of a first via-hole that penetrates the pattern of the barrier layer so as to expose a first part of the pattern of the active layer, and the pattern of the source electrode is connected to the first part of the pattern of the active layer through the first via-hole;

the second via-hole region of the pattern of the barrier layer comprises a pattern of a second via-hole that penetrates the pattern of the barrier layer so as to expose a second part of the pattern of the active layer, and the pattern of the drain electrode is connected to the second part of the pattern of the active layer through the second via-hole;

the first thickness region of the pattern of the barrier layer is located above the pattern of the gate insulating layer and an orthographic projection of the pattern of the pixel electrode on the base substrate is same as that of the first thickness region of the pattern of the barrier layer;

the second thickness region of the pattern of the barrier layer is a remaining region of the pattern of the barrier layer other than the first via-hole region, the second via-hole region, and the first thickness region, a thickness of the second thickness region is less than that of the first thickness region, and an entirety of a remaining portion of the pattern of the active layer not exposed by the pattern of the first via-hole and the pattern of the second via-hole is covered by the second thickness region;

a portion of the pattern of the drain electrode is arranged on a portion of the pattern of the pixel electrode; and the pattern of the pixel electrode is located above the first thickness region of the pattern of the barrier layer, and an outermost boundary of the pattern of the pixel electrode is a same as that of the first thickness region.

2. The method according to claim 1, wherein the third step comprises:

a step of coating a positive photoresist onto the pixel electrode film;

a step of exposing the photoresist so as to form an unexposed region corresponding to a region where the pattern of the pixel electrode is located, a fully-exposed region corresponding to a region where the pattern of the first via-hole is located and a region where the pattern of the second via-hole is located, and a partially-exposed region corresponding to a region other than the region where the pattern of the pixel electrode is located, the region where the pattern of the first via-hole is located, and the region where the pattern of the second via-hole is located;

a step of developing the photoresist so that a thickness of the photoresist at the unexposed region remains unchanged so as to form a photoresist fully-reserved region, a thickness of the photoresist at the partially-exposed region is reduced so as to form a photoresist partially-reserved region, and the photoresist at the fully-exposed region is fully removed so as to form a photoresist fully-removed region;

a step of fully etching off the pixel electrode film corresponding to the photoresist fully-removed region by a first etching step;

a step of partially removing the barrier layer film corresponding to the photoresist fully-removed region by a second etching step;

a step of ashing and removing the photoresist according to a thickness of the photoresist partially-reserved region, so as to fully remove the photoresist at the photoresist partially-reserved region and reduce the thickness of the photoresist at the photoresist fully-reserved region;

a step of fully etching off the pixel electrode film corresponding to the photoresist partially-reserved region by a third etching step;

a step of fully etching off the remaining barrier layer film at the photoresist fully-removed region by a fourth etching step so as to expose the pattern of the active layer, thereby to form the pattern of the barrier layer having the pattern of the first via-hole and the pattern of the second via-hole connecting the pattern of the active layer and the source electrode and the drain electrode of the thin film transistor, the thickness of the barrier layer film remained in the photoresist fully-removed region being reduced due to the barrier layer film at the photoresist partially-reserved region; and a step of removing the remaining photoresist so as to expose the pattern of the pixel electrode.

3. The method according to claim 1, wherein prior to the first step, the method further comprises:

a step of forming a pattern of a gate line, a pattern of a gate electrode, and a pattern of a common electrode line on the base substrate by a patterning process.

4. The method according to claim 3, wherein the fourth step further comprises:

a step of forming a data line and a channel region of the thin film transistor on the base substrate with the pattern of the barrier layer and the pattern of the pixel electrode;

a step of forming a passivation layer provided with a third via-hole on the base substrate with the data line, the source electrode, the drain electrode, and the channel region, so that the third via-hole is located in the second thickness region of the pattern of the barrier layer and penetrates through the passivation layer, the pattern of the barrier layer, and the pattern of the gate insulating layer to expose the common electrode line; and a step of forming a pattern of a second electrode on the passivation layer so that the pattern of the second electrode is electrically connected to the common electrode line via the third via-hole.

5. The method according to claim 1, wherein the photoresist is developed using a half-tone or gray-tone mask plate.

6. A display substrate, comprising:

a pattern of a gate insulating layer on a base substrate, a pattern of an active layer on the pattern of the gate insulating layer, a pattern of a barrier layer, a pattern of a pixel electrode, a pattern of a source electrode of a thin film transistor, and a pattern of a drain electrode of the thin film transistor, wherein, the pattern of the barrier layer is located above the pattern of the gate insulating layer and the pattern of the active layer, and comprises a first via-hole region, a second via-hole region, a first thickness region, and a second thickness region;

the first via-hole region of the pattern of the barrier layer comprises a pattern of a first via-hole that penetrates the pattern of the barrier layer so as to expose a first part of the pattern of the active layer, and the pattern of the source electrode is connected to the first part of the pattern of the active layer through the first via-hole;

the second via-hole region of the pattern of the barrier layer comprises a pattern of a second via-hole that penetrates the pattern of the barrier layer so as to expose a second part of the pattern of the active layer, and the pattern of the drain electrode is connected to the second part of the pattern of the active layer through the second via-hole;

the first thickness region of the pattern of the barrier layer is located above the pattern of the gate insulating layer and an orthographic projection of the pattern of the pixel electrode on the base substrate is same as that of the first thickness region of the pattern of the barrier layer;

the second thickness region of the pattern of the barrier layer is a remaining region of the pattern of the barrier layer other than the first via-hole region, the second via-hole region, and the first thickness region, a thickness of the second thickness region is less than that of the first thickness region, and an entirety of a remaining portion of the pattern of the active layer not exposed by the pattern of the first via-hole and the pattern of the second via-hole is covered by the second thickness region;

a portion of the pattern of the drain electrode is arranged on a portion of the pattern of the pixel electrode, and the pattern of the pixel electrode is located above the first thickness region of the pattern of the barrier layer, and an outermost boundary of the pattern of the pixel electrode is a same as that of the first thickness region.

7. The display substrate according to claim 6, wherein the pattern of the first via-hole in the pattern of the barrier layer is completely located above the pattern of the active layer.

8. The display substrate according to claim 6, wherein the pattern of the first via-hole in the pattern of the barrier layer is located above the pattern of the active layer and the pattern of the gate insulating layer.

9. The display substrate according to claim 6, further comprising:
  a gate line,
  a gate electrode,
  a common electrode line,
  a data line,
  a passivation layer, and
  a second electrode,
  wherein the gate line, the gate electrode, and the common electrode line are located above the base substrate and are covered by the pattern of the gate insulating layer,
  the source electrode of the thin film transistor, the drain electrode of the thin film transistor, and the data line are located on a surface of the pattern of the barrier layer and a surface of the pattern of the pixel electrode,
  the passivation layer is provided with a third via-hole located in the second thickness region of the pattern of the barrier layer, and the passivation layer is located on a surface of the data line, a surface of the source electrode, and a surface of the drain electrode, and the third via-hole penetrates through the passivation layer, the pattern of the barrier layer, and the pattern of the gate insulating layer so as to expose the common electrode line, and
  the second electrode is located on a surface of the passivation layer and is electrically connected to the common electrode line via the third via-hole.

10. The display substrate according to claim 6, wherein the pattern of the active layer is made of a transparent metal oxide material with semiconductor properties.

11. A display device comprising the display substrate according to claim 6.

12. The display device according to claim 11, wherein the pattern of the first via-hole in the pattern of the barrier layer is completely located above the pattern of the active layer.

13. The display device according to claim 11, wherein the pattern of the first via-hole in the pattern of the barrier layer is located above the pattern of the active layer and the pattern of the gate insulating layer.

14. The display device according to claim 11, further comprising:
  a gate line,
  a gate electrode,
  a common electrode line,
  a data line,
  a passivation layer, and
  a second electrode,
  wherein the gate line, the gate electrode, and the common electrode line are located above the base substrate and are covered by the pattern of the gate insulating layer;
  the source electrode of the thin film transistor, the drain electrode of the thin film transistor, and the data line are located on a surface of the pattern of the barrier layer and a surface the pattern of the pixel electrode;
  the passivation layer is provided with a third via-hole located in the second thickness region of the pattern of the barrier layer and is located on a surface of the data line, a surface of the source electrode, and a surface of the drain electrode, and the third via-hole penetrates through the passivation layer, the pattern of the barrier layer, and the pattern of the gate insulating layer so as to expose the common electrode line; and
  the second electrode is located on a surface of the passivation layer and is electrically connected to the common electrode line via the third via-hole.

15. The display device according to claim 11, wherein the pattern of the active layer is made of a transparent metal oxide material with semiconductor properties.

16. The display substrate according to claim 6, wherein the pattern of the pixel electrode is a planar electrode, and is between a first part of the second thickness region of the pattern of the barrier layer and a second part of the second thickness region of the pattern of the barrier layer.

17. The display substrate according to claim 6, wherein a projection of the pattern of the pixel electrode on the base substrate is spaced apart from a projection of the pattern of the active layer on the base substrate.

18. The display substrate according to claim 6, wherein a remaining portion of the pattern of the drain electrode other than the portion of the pattern of the draining electrode arranged on the portion of the pattern of the pixel electrode is arranged on the second thickness region and the second via-hole region.

19. The display substrate according to claim 6, wherein a portion of the pattern of the drain electrode is arranged on the second thickness region, and between the second via-hole region and the portion of the pattern of the drain electrode arranged on the portion of the pattern of the pixel electrode.

* * * * *